(12) United States Patent
Nakagawa et al.

(10) Patent No.: US 8,125,084 B2
(45) Date of Patent: Feb. 28, 2012

(54) SEMICONDUCTOR DEVICE AND SEMICONDUCTOR DEVICE MANUFACTURING METHOD

(75) Inventors: Ryosuke Nakagawa, Kyoto (JP); Takahisa Yamaha, Kyoto (JP); Yuichi Nakao, Kyoto (JP); Katsumi Sameshima, Kyoto (JP); Satoshi Kageyama, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 228 days.

(21) Appl. No.: 12/445,168

(22) PCT Filed: Oct. 11, 2007

(86) PCT No.: PCT/JP2007/069875
§ 371 (c)(1),
(2), (4) Date: Apr. 10, 2009

(87) PCT Pub. No.: WO2008/047687
PCT Pub. Date: Apr. 24, 2008

(65) Prior Publication Data
US 2010/0032837 A1   Feb. 11, 2010

(30) Foreign Application Priority Data

Oct. 12, 2006  (JP) .................................. 2006-278789

(51) Int. Cl.
*H01L 23/48* (2006.01)
*H01L 23/52* (2006.01)
*H01L 29/40* (2006.01)

(52) U.S. Cl. ........................................ 257/751; 257/758

(58) Field of Classification Search .................... 257/751
See application file for complete search history.

(56) References Cited

U.S. PATENT DOCUMENTS

| 5,893,752 A | 4/1999 | Zhang et al. |
| 6,028,003 A | 2/2000 | Frisa et al. |
| 6,468,898 B1 | 10/2002 | Usami |
| 2004/0175931 A1 | 9/2004 | Nishibe et al. |
| 2004/0207085 A1 | 10/2004 | Fujii et al. |
| 2005/0051899 A1 | 3/2005 | Nakatani et al. |
| 2008/0083989 A1 | 4/2008 | Aoi et al. |
| 2008/0116577 A1 | 5/2008 | Nakatani et al. |

FOREIGN PATENT DOCUMENTS

| JP | 11-074227 | 3/1999 |
| JP | 11-265890 | 9/1999 |
| JP | 2000-294630 | 10/2000 |
| JP | 2001-102446 | 4/2001 |
| JP | 2001-127153 | 5/2001 |
| JP | 2004-172337 | 6/2004 |
| JP | 2004-260001 | 9/2004 |
| JP | 2004-319834 | 11/2004 |
| JP | 2005-085884 | 3/2005 |
| JP | 2006-005305 | 1/2006 |

*Primary Examiner* — Thien F Tran
(74) *Attorney, Agent, or Firm* — Rabin & Berdo, PC (57) ABSTRACT

A semiconductor device according to the present invention includes: a semiconductor substrate; a first copper interconnection provided on the semiconductor substrate; an insulating layer provided over the first copper interconnection and having a hole extending therethrough to the first copper interconnection; a barrier layer composed of a tantalum-containing material and covering at least a sidewall of the hole and a part of the first copper interconnection exposed in the hole; and a second copper interconnection provided in intimate contact with the barrier layer and electrically connected to the first copper interconnection via the barrier layer; wherein the barrier layer has a nitrogen concentration profile such that the concentration of nitrogen contained in the material varies to be lower in a boundary portion of the barrier layer adjacent to the first copper interconnection and in a boundary portion of the barrier layer adjacent to the second copper interconnection and higher in an intermediate portion of the barrier layer defined between the boundary portions.

6 Claims, 6 Drawing Sheets

SEMICONDUCTOR DEVICE AND SEMICONDUCTOR DEVICE MANUFACTURING METHOD

TECHNICAL FIELD

The present invention relates to a semiconductor device and a semiconductor device manufacturing method and, more specifically, to a semiconductor device having a damascene interconnect and to a manufacturing method for the semiconductor device.

BACKGROUND ART

In recent years, there is a demand for microminiaturization of an interconnection for higher density integration on a semiconductor device. To meet the demand, it is under consideration to use a copper (Cu) interconnection having lower electrical resistance instead of a conventional aluminum (Al) interconnection as the interconnection for the semiconductor device.

A damascene process is known as an exemplary method for forming a minute copper interconnection.

In the damascene process, for example, a first interconnection trench conformal to a predetermined interconnection pattern is first formed in a first interlevel insulating film of silicon oxide ($SiO_2$) formed on a silicon substrate. Then, a copper film is formed over the first interlevel insulating film as filling the first interconnection trench. In turn, an unnecessary portion of the copper film present outside the first interconnection trench is removed by polishing the copper film through a chemical mechanical polishing method (CMP method), whereby a first copper interconnection is formed as embedded in the first interconnection trench. Subsequently, a second interlevel insulating film is formed over the first interlevel insulating film, and a via-hole is formed in the second interlevel insulating film as extending to the first copper interconnection. Then, a third interlevel insulating film is formed on the second interlevel insulating film having the via-hole. In turn, a second interconnection trench is formed in the third interlevel insulating film, and a second copper interconnection electrically connected to the first copper interconnection is formed in substantially the same manner as the formation of the first copper interconnection by filling the via-hole and the second interconnection trench with copper.

Copper is more diffusive into silicon oxide than aluminum. Therefore, copper is liable to diffuse into the interlevel insulating film of silicon oxide, thereby causing short circuits between interconnections.

In order to prevent copper from diffusing into the interlevel insulating film, for example, a barrier film is formed between the copper interconnection and the interlevel insulating film. Exemplary materials for the barrier film include tantalum (Ta) and tantalum nitride (TaN).

Patent Document 1: Japanese Unexamined Patent Publication No. 11-265890

DISCLOSURE OF THE INVENTION

Problems to be Solved by the Invention

Tantalum is highly adhesive to copper. Therefore, separation of the barrier film in an interface between the barrier film and the copper interconnection is suppressed by forming the barrier film from tantalum. However, tantalum is less capable of preventing the diffusion of copper. In order to impart the tantalum barrier film with a sufficient copper diffusion preventing capability, it is necessary to increase the thickness of the barrier film. However, the increase in film thickness increases the electrical resistance of the film, thereby reducing electrical conductivity between the first copper interconnection and the second copper interconnection.

On the other hand, tantalum nitride is superior in copper diffusion preventing capability to tantalum, but less adhesive to copper. Therefore, separation of the barrier film is liable to occur in the interface between the barrier film and the copper interconnection.

It is therefore an object of the present invention to provide a semiconductor device having a barrier layer excellent in adhesiveness to copper and copper diffusion preventing capability, and to provide a manufacturing method for the semiconductor device.

Means for Solving the Problems

To achieve the aforementioned object, a semiconductor device according to the present invention includes: a semiconductor substrate; a first copper interconnection provided on the semiconductor substrate; an insulating layer provided over the first copper interconnection and having a hole extending therethrough to the first copper interconnection; a barrier layer composed of a tantalum-containing material and covering at least a sidewall of the hole and a part of the first copper interconnection exposed in the hole; and a second copper interconnection provided in intimate contact with the barrier layer and electrically connected to the first copper interconnection via the barrier layer; wherein the barrier layer has a nitrogen concentration profile such that the concentration of nitrogen contained in the material varies to be lower in a boundary portion of the barrier layer adjacent to the first copper interconnection and in a boundary portion of the barrier layer adjacent to the second copper interconnection and higher in an intermediate portion of the barrier layer defined between the boundary portions.

With this arrangement, the first copper interconnection is provided on the semiconductor substrate, and the insulating layer having the hole extending therethrough to the first copper interconnection is provided on the first copper interconnection. Further, the barrier layer covers at least the sidewall of the hole of the insulating layer and the part of the first copper interconnection exposed in the hole. The second copper interconnection is provided in intimate contact with the barrier layer and electrically connected to the first copper interconnection via the barrier layer. Further, the barrier layer is composed of the tantalum-containing material, and the nitrogen concentration profile of the barrier layer is such that the concentration of nitrogen contained in the material varies to be lower in the boundary portions of the barrier layer adjacent to the first and second copper interconnections and higher in the intermediate portion of the barrier layer defined between the boundary portions.

The concentration of nitrogen contained in the barrier layer material, i.e., the nitridation degree of the barrier layer, is relatively low in the boundary portions of the barrier layer adjacent to the first and second copper interconnections, so that the physical properties of the barrier layer material in the boundary portions are closer to those of tantalum. As a result, the barrier layer properly adheres to the first and second copper interconnections. On the other hand, the concentration of nitrogen contained in the barrier layer material is relatively high in the intermediate portion of the barrier layer defined between the boundary portions of the barrier layer adjacent to the first and second copper interconnections, so that the physical properties of the barrier layer material in the intermediate portion are closer to those of tantalum nitride. As a result, copper of the first and second copper interconnections is prevented from diffusing into the insulating layer.

That is, the barrier layer, which is of a single layer structure, is formed as having the physical properties of tantalum as well as the physical properties of tantalum nitride without an increase in thickness by continuously varying the concentration of nitrogen contained in the barrier layer material.

A semiconductor device manufacturing method according to the present invention includes: a first copper interconnection forming step of forming a first copper interconnection on a semiconductor substrate; an insulating layer forming step of forming an insulating layer over the first copper interconnection; a hole forming step of forming a hole extending to the first copper interconnection in the insulating layer; a barrier layer forming step of forming a barrier layer of a tantalum-containing material which covers at least a sidewall of the hole and a part of the first copper interconnection exposed in the hole by a sputtering method; and a second copper interconnection forming step of forming a second copper interconnection in intimate contact with the barrier layer, the second copper interconnection being electrical connected to the first copper interconnection via the barrier layer; wherein a nitrogen gas concentration in an ambient environment around the semiconductor substrate is controlled to be lower at the initial stage and the final stage of the barrier layer forming step, and is controlled to be higher at the intermediate stage of the barrier layer forming step. The aforementioned semiconductor device is produced by this method.

Further, the barrier layer is formed as having a single layer structure and imparted with the physical properties of tantalum as well as the physical properties of tantalum nitride by continuously varying the nitrogen gas concentration. Thus, the manufacturing process is simplified.

The foregoing and other objects, features and effects of the present invention will become more apparent from the following description of the embodiments with reference to the attached drawings.

BEST MODE FOR CARRYING OUT THE INVENTION

Figure 1:
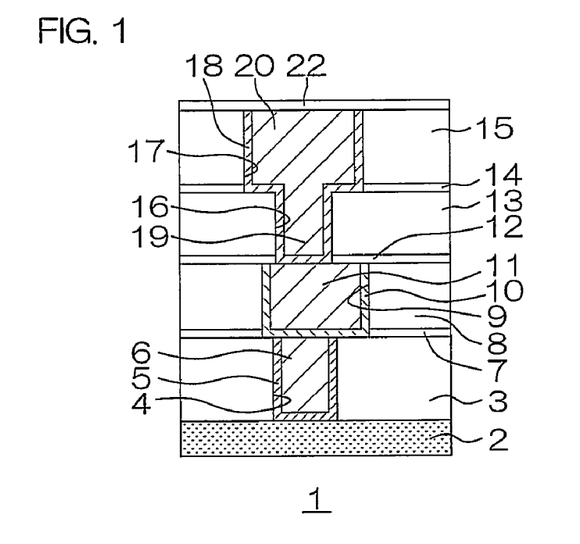
FIG. 1 is a schematic sectional view showing the construction of a semiconductor device according to one embodiment of the present invention.

FIG. 1 is a schematic sectional view showing the construction of a semiconductor device according to one embodiment of the present invention.

The semiconductor device 1 includes a silicon substrate 2 (semiconductor substrate) having a semiconductor element and the like formed in a front surface thereof.

An interlevel insulating film 3 of silicon oxide is provided on the silicon substrate 2.

The interlevel insulating film 3 has a via-hole 4 extending therethrough to a semiconductor element region (not shown) on the silicon substrate 2.

An electrically conductive TiN film (titanium nitride film) 5 covers a sidewall of the via-hole 4 and a part of the silicon substrate 2 exposed in the via-hole 4. A tungsten plug 6, which is formed by filling a tungsten-containing metal in the via-hole 4 to a level flush with an upper surface of the interlevel insulating film 3, is provided in the via-hole 4 with the intervention of the TiN film 5. The tungsten plug 6 is electrically connected to the silicon substrate 2 via the TiN film 5.

An interlevel film 7 of silicon carbide (SiC) is provided on the interlevel insulating film 3. Further, an interlevel insulating film 8 of silicon oxide is provided on the interlevel film 7.

A first interconnection trench 9 extends through the interlevel insulating film 8 and the interlevel film 7 to communicate with the via hole 4.

A tungsten plug barrier film 10 covers an interior surface of the first copper interconnection trench 9, a part of the interlevel insulating film 3 exposed in the first copper interconnection trench 9 and an upper surface of the tungsten plug 6. The tungsten plug barrier film 10 is of a double layer structure which includes a tantalum film and a tantalum nitride film stacked one on the other. For example, the tantalum nitride film is provided on the side of the tungsten plug 6, and the tantalum film is provided on the tantalum nitride film.

A first copper interconnection layer 11 (first copper interconnection), which is formed by filling a copper-containing metal in the first copper interconnection trench 9, is provided in the first copper interconnection trench 9 with the intervention of the tungsten plug barrier film 10. The first copper interconnection layer 11 is electrically connected to the silicon substrate 2 via the tungsten plug 6.

Further, an interlevel film 12 of silicon carbide, an interlevel insulating film 13 of silicon oxide, an interlevel film 14 of silicon carbide and an interlevel insulating film 15 of silicon oxide are provided in this order on the interlevel insulating film 8. The interlevel film 12, the interlevel insulating film 13, the interlevel film 14 and the interlevel insulating film 15 correspond to the insulating layer according to the present invention.

A via-hole 16 extends through the interlevel insulating film 13 and the interlevel film 12 to the first copper interconnection layer 11.

A second copper interconnection trench 17 extends through the interlevel insulating film 15 and the interlevel film 14. The second copper interconnection trench 17 communicates with the via-hole 16.

A copper interconnection barrier film 18 (barrier layer) covers a sidewall of the second copper interconnection trench 17, a sidewall of the via-hole 16 and a part of the first copper interconnection layer 11 exposed in the via-hole 16. The copper interconnection barrier film 18 has a thickness of, for example, 3 to 30 nm, preferably 3 to 15 nm.

A connection plug 19, which is formed by filling a copper-containing metal in the via-hole 16, is provided in the via-hole 16 with the intervention of the copper interconnection barrier film 18. Further, a second copper interconnection layer 20 (second copper interconnection), which is formed by filling copper in the second copper interconnection trench 17, is provided in the second copper interconnection trench 17. The second copper interconnection layer 20 is electrically connected to the first copper interconnection layer 11 via the connection plug 19 and the copper interconnection barrier film 18.

An insulating film 22 is provided over the interlevel insulating film 15 as covering the second copper interconnection layer 20 for prevention of oxidation of the second copper interconnection layer 20.

Figure 2:
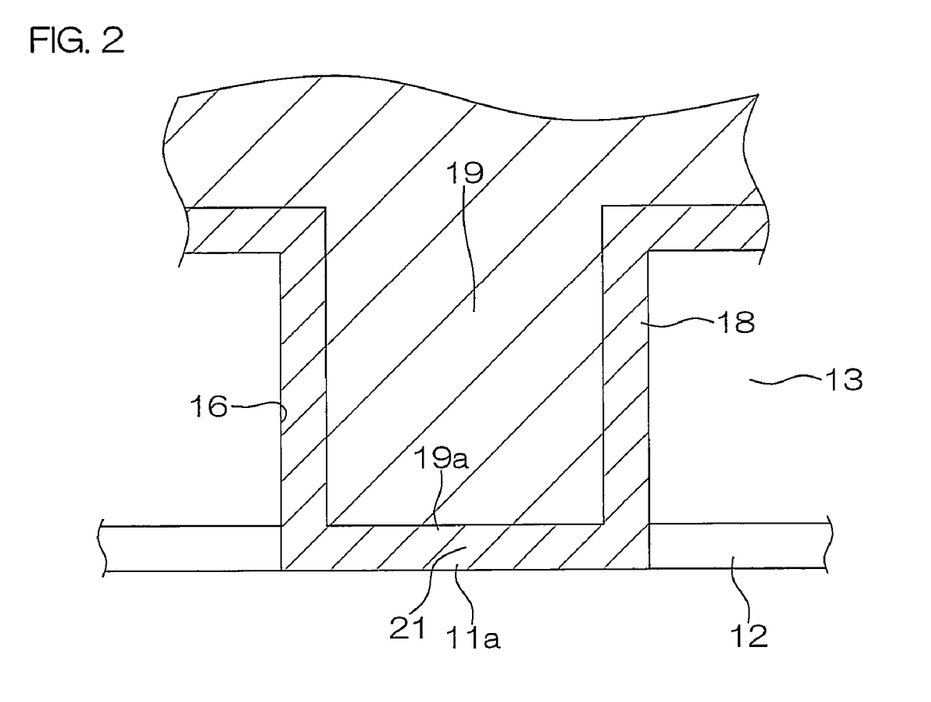
FIG. 2 is an enlarged sectional view illustrating a portion around a copper interconnection barrier film shown in FIG. 1.
Figure 3:
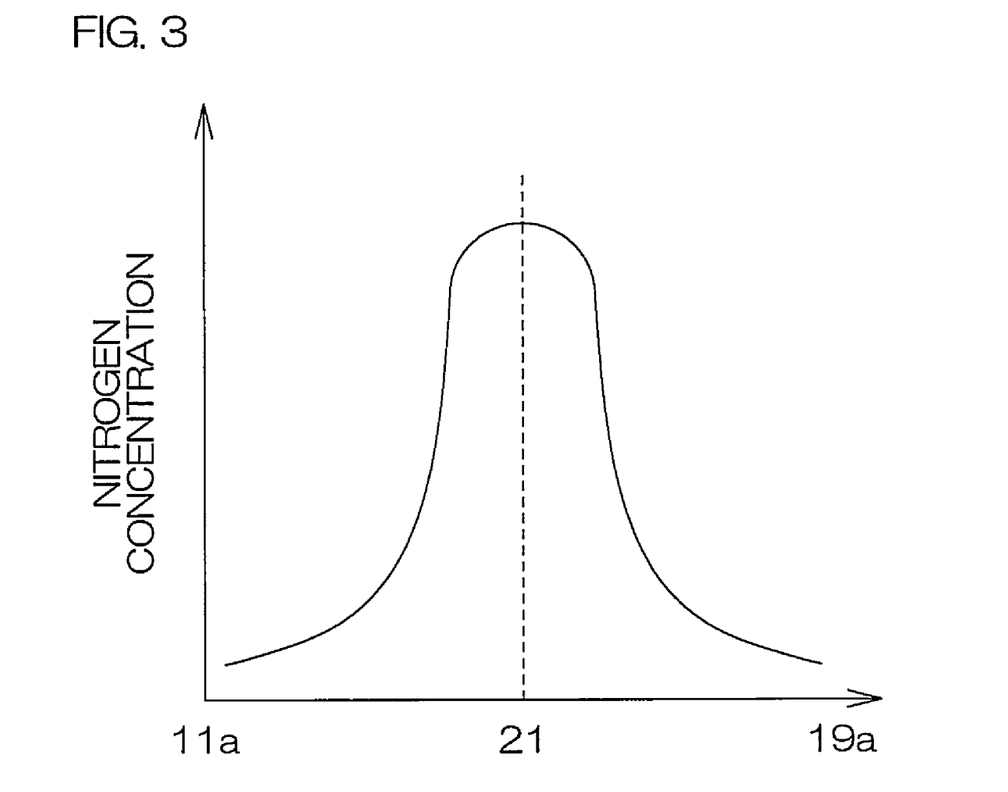
FIG. 3 shows a nitrogen concentration profile indicating the concentration of nitrogen contained in the copper interconnection barrier film.

FIG. 2 is an enlarged sectional view illustrating a portion around the copper interconnection barrier film 18 shown in FIG. 1. FIG. 3 shows a nitrogen concentration profile indicating the concentration of nitrogen contained in the copper interconnection barrier film 18.

The copper interconnection barrier film 18 is composed of a tantalum-containing material represented by $Ta_{1-x}N_x$ ($x \geq 0$).

The copper interconnection barrier film 18 has a nitrogen concentration profile such that the concentration of nitrogen contained in the material varies to be relatively low (with a relatively small x) in a boundary portion 11a of the copper interconnection barrier film 18 adjacent to the first copper interconnection layer 11 and in a boundary portion 19a of the copper interconnection barrier film 18 adjacent to the connection plug 19 (to be described later) and relatively high (with a relatively great x) in an intermediate portion 21 of the copper interconnection barrier film 18 defined between the boundary portions 11a and 19a.

FIGS. 4A to 4L are schematic sectional views showing a process sequence of a manufacturing method for the semiconductor device 1.

The manufacturing method for the semiconductor device 1 will next be described with reference to FIGS. 4A to 4L.

Figure 4A:
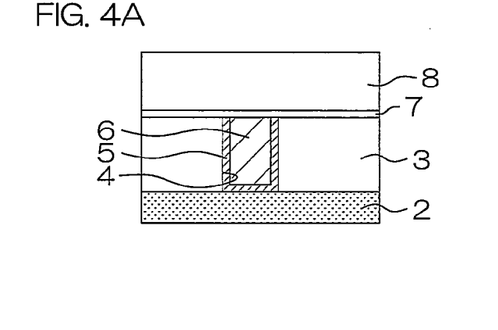
FIG. 4A is a schematic sectional view showing a manufacturing method for the semiconductor device shown in FIG. 1.

For manufacture of the semiconductor device 1, an interlevel insulating film 3 is first formed on a silicon substrate 2 as shown in FIG. 4A. Then, a via-hole 4 is formed in the interlevel insulating film 3 as extending through the interlevel insulating film 3 to a semiconductor element region (not shown) of the silicon substrate 2. In turn, a TiN film 5 is formed as covering a sidewall of the via-hole 4 and a part of the silicon substrate 2 exposed in the via-hole 4, for example, by a sputtering method. Thereafter, a tungsten plug 6 is formed in the via-hole 4 with the intervention of the TiN film 5 by filling tungsten in the via-hole 4. Then, an interlevel film 7 and an interlevel insulating film 8 are formed in this order over the interlevel insulating film 3.

Figure 4B:
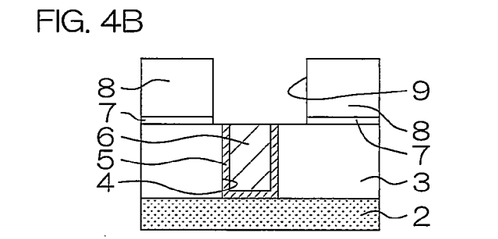
FIG. 4B is a schematic sectional view showing a step subsequent to the step of FIG. 4A in the manufacturing method for the semiconductor device shown in FIG. 1.

Subsequently, as shown in FIG. 4B, the interlevel film 7 and the interlevel insulating film 8 are partly etched so as to expose an upper surface of the tungsten plug 6, for example, by photolithography, whereby a first copper interconnection trench 9 is formed.

Figure 4C:
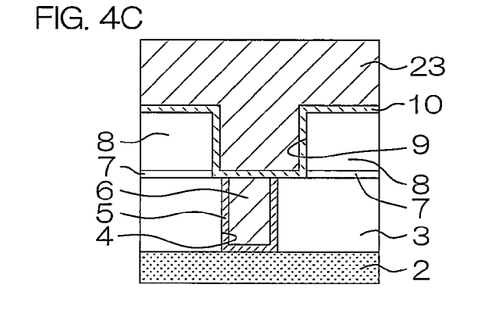
FIG. 4C is a schematic sectional view showing a step subsequent to the step of FIG. 4B in the manufacturing method for the semiconductor device shown in FIG. 1.

Thereafter, as shown in FIG. 4C, a tantalum nitride film and a tantalum film are formed in this order as covering an upper surface of the interlevel insulating film 8 and an interior surface of the first copper interconnection trench 9, for example, by a sputtering method, whereby a tungsten plug barrier film 10 is formed. Then, a copper film 23 is formed over the interlevel insulating film 8 as filling the first copper interconnection trench, for example, by an electrolytic plating method, a sputtering method, a CVD method or the like.

Figure 4D:
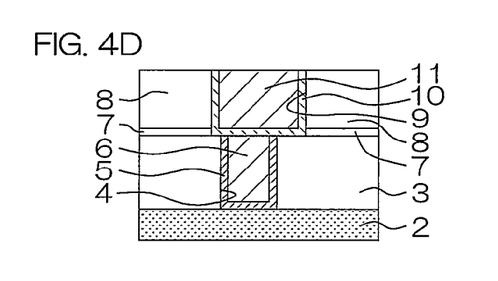
FIG. 4D is a schematic sectional view showing a step subsequent to the step of FIG. 4C in the manufacturing method for the semiconductor device shown in FIG. 1.

Subsequently, the copper film 23 is polished by a CMP method. The polishing is continued until a surface of the copper film 23 becomes flush with a surface of the interlevel insulating film 8. Thus, unnecessary portions of the copper film 23 and the tungsten plug barrier film 10 present outside the first copper interconnection trench 9 are removed as shown in FIG. 4D, whereby a first copper interconnection layer 11 is formed as embedded in the first copper interconnection trench 9 (first copper interconnection forming step).

Figure 4E:
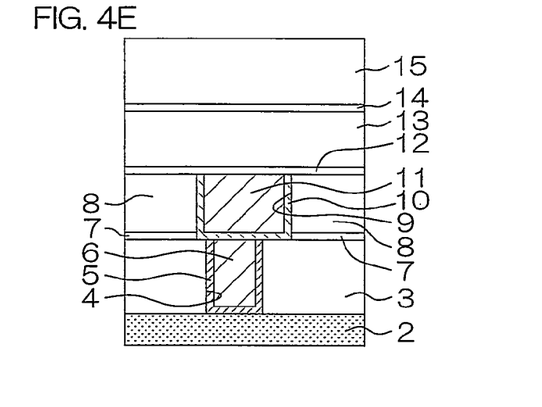
FIG. 4E is a schematic sectional view showing a step subsequent to the step of FIG. 4D in the manufacturing method for the semiconductor device shown in FIG. 1.

In turn, as shown in FIG. 4E, an interlevel film 12, an interlevel insulating film 13, an interlevel film 14 and an interlevel insulating film 15 are formed in this order over the interlevel insulating film 8 (insulating layer forming step).

Figure 4F:
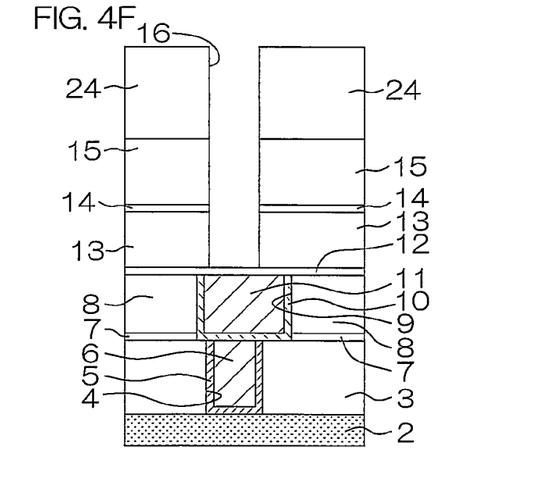
FIG. 4F is a schematic sectional view showing a step subsequent to the step of FIG. 4E in the manufacturing method for the semiconductor device shown in FIG. 1.

Then, as shown in FIG. 4F, a photoresist 24 having a pattern conformal to a via-hole 16 is formed on the interlevel insulating film 15. In turn, the interlevel insulating film 15, the interlevel film 14 and the interlevel insulating film 13 are etched by using the photoresist 24 as a mask, whereby the via-hole 16 is formed as extending through these films (hole forming step). Before the completion of the etching of the interlevel insulating film 13, etching conditions are changed such that the etch selectivity between the interlevel insulating film 13 and the interlevel film 12 is increased to substantially prevent the interlevel film 12 from being etched.

Figure 4G:
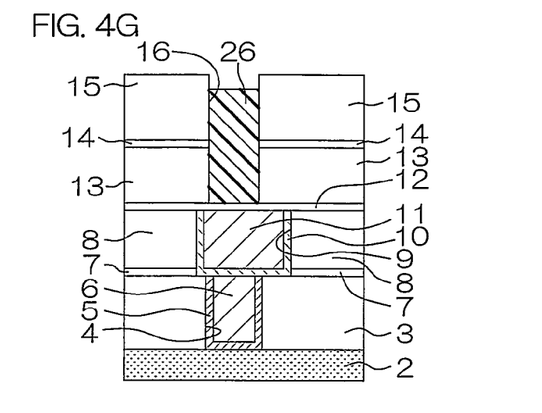
FIG. 4G is a schematic sectional view showing a step subsequent to the step of FIG. 4F in the manufacturing method for the semiconductor device shown in FIG. 1.

Subsequently, as shown in FIG. 4G, the photoresist 24 is removed by ashing, and then a filler 26 such as of a resin is filled in the via-hole 16 and etched back. Thus, a filler portion 26 having a predetermined height is formed in the via-hole 16.

Figure 4H:
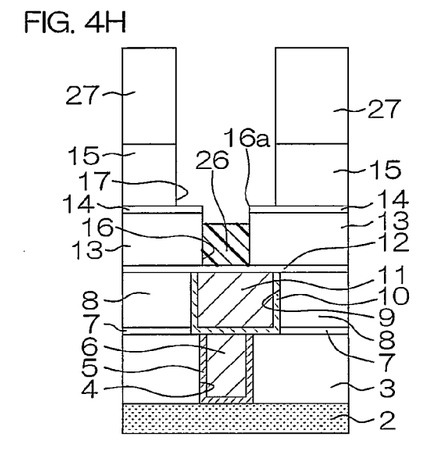
FIG. 4H is a schematic sectional view showing a step subsequent to the step of FIG. 4G in the manufacturing method for the semiconductor device shown in FIG. 1.

Then, as shown in FIG. 4H, a photoresist 27 having a pattern conformal to a second copper interconnection trench 17 is formed on the interlevel insulating film 15. Then, the interlevel insulating film 15 is etched by using the photoresist 27 as a mask, whereby the second copper interconnection trench 17 is formed to expose an opening surface 16a of the via-hole 16. At this time, the filler portion 26 is also etched to some extent by an etching liquid.

Figure 4I:
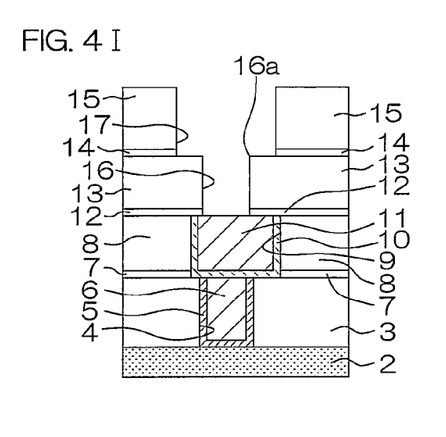
FIG. 4I is a schematic sectional view showing a step subsequent to the step of FIG. 4H in the manufacturing method for the semiconductor device shown in FIG. 1.

In turn, as shown in FIG. 4I, the photoresist 27 and the filler portion 26 are removed by ashing. Then, a part of the interlevel film 12 is etched away.

Figure 4J:
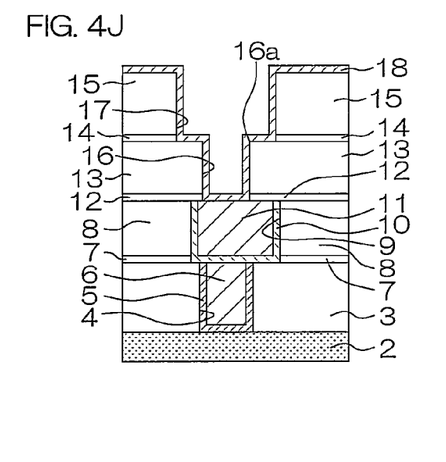
FIG. 4J is a schematic sectional view showing a step subsequent to the step of FIG. 4I in the manufacturing method for the semiconductor device shown in FIG. 1.

Subsequently, as shown in FIG. 4J, a copper interconnection barrier film 18 is formed as covering an upper surface of the interlevel insulating film 15, a sidewall of the via-hole 16, an interior surface of the second copper interconnection trench 17 and a part of the first copper interconnection layer 11 exposed in the via-hole 16 by a sputtering method (barrier layer forming step).

Figure 4K:
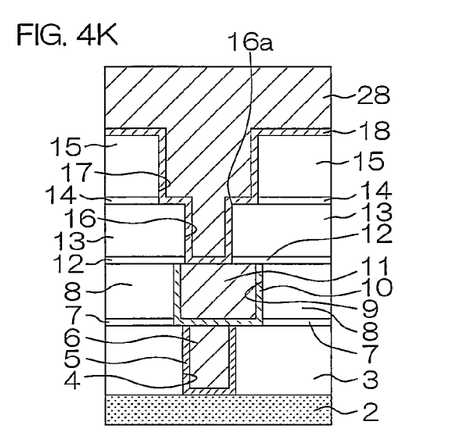
FIG. 4K is a schematic sectional view showing a step subsequent to the step of FIG. 4J in the manufacturing method for the semiconductor device shown in FIG. 1.

After the formation of the copper interconnection barrier film 18, as shown in FIG. 4K, a copper film 28 is formed over the interlevel insulating film 15 as filling the second copper interconnection trench 17, for example, by an electrolytic plating method, a sputtering method, a CVD method or the like.

Figure 4L:
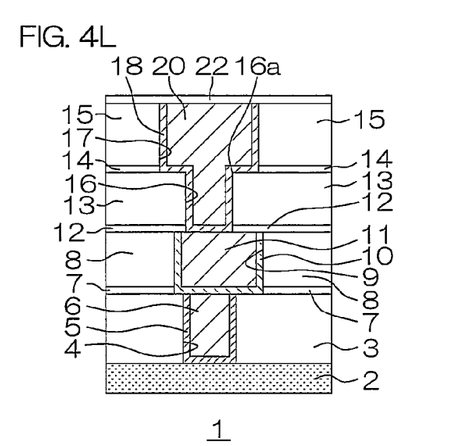
FIG. 4L is a schematic sectional view showing a step subsequent to the step of FIG. 4K in the manufacturing method for the semiconductor device shown in FIG. 1.

Then, the copper film 28 is polished by a CMP method. The polishing is continued until a surface of the copper film 28 becomes flush with a surface of the interlevel insulating film 15. Thus, unnecessary portions of the copper film 28 and the copper interconnection barrier film 18 present outside the second copper interconnection trench 17 are removed as shown in FIG. 4L, whereby a second copper interconnection layer 20 is formed as embedded in the second copper interconnection trench 17 (second copper interconnection forming step). Thereafter, an insulating film 22 is formed over the interlevel insulating film 15 and the second copper interconnection layer 20. Thus, a semiconductor device 1 is completed.

Figure 5:
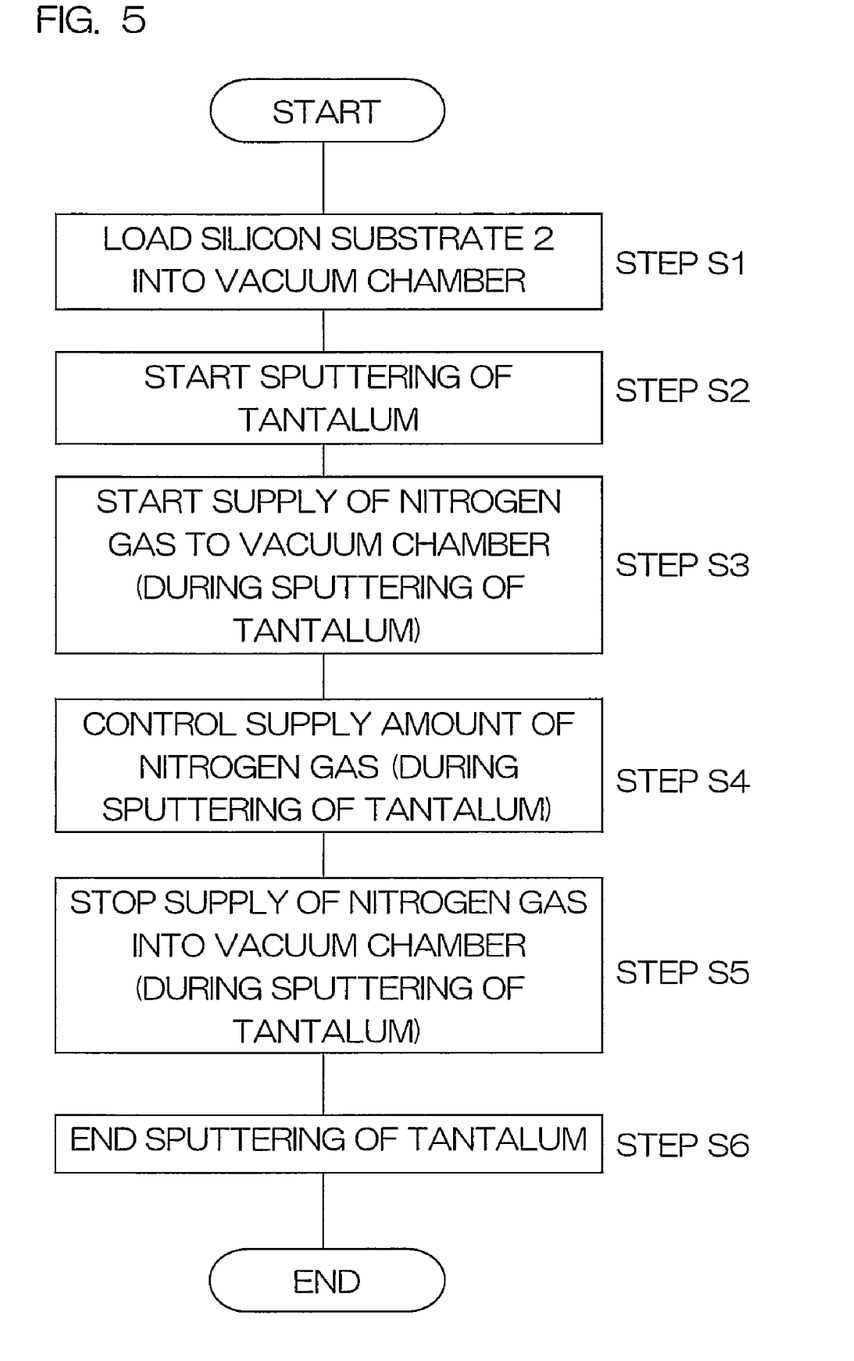
FIG. 5 is a flow chart showing a process sequence for forming the copper interconnection barrier film.
Figure 6:
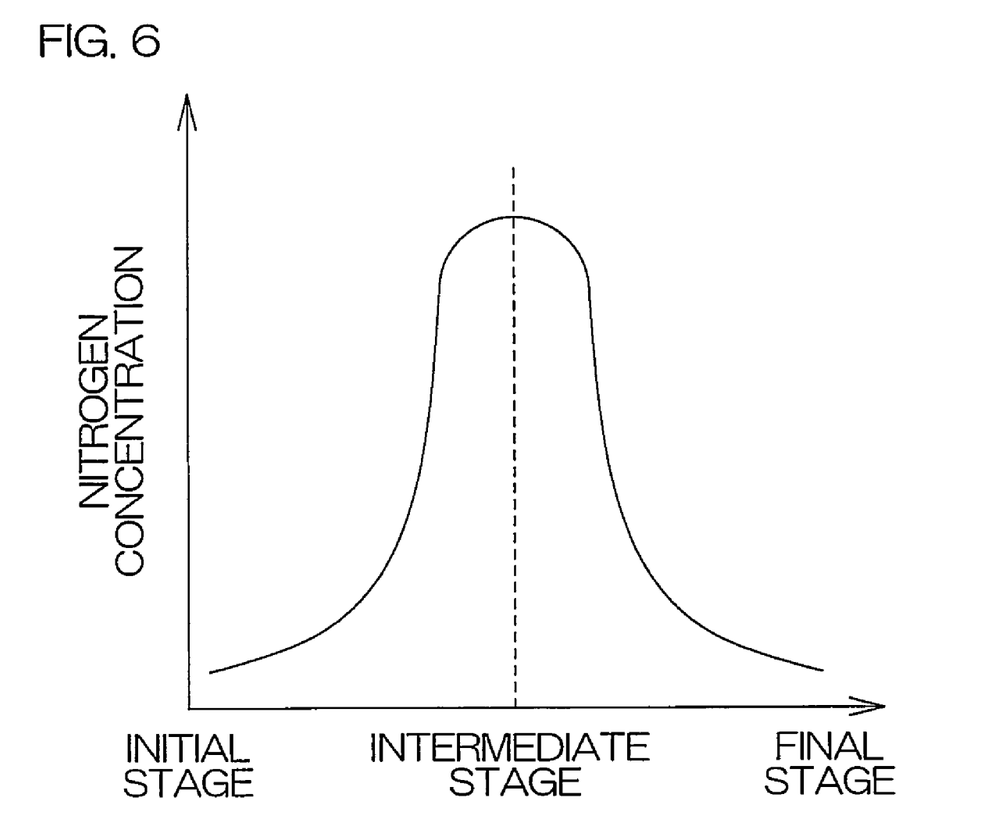
FIG. 6 shows a profile of a nitrogen gas concentration in a vacuum chamber in the copper interconnection barrier film forming process.

FIG. 5 is a flow chart showing a process sequence for forming the copper interconnection barrier film 18. FIG. 6 shows a profile of a nitrogen gas concentration in a vacuum chamber in the process for forming the copper interconnection barrier film 18.

Referring to FIG. 5, the silicon substrate 2 is first loaded into a vacuum chamber of a sputtering apparatus not shown for the formation of the copper interconnection barrier film 18 (Step S1). In turn, the sputtering of tantalum with the use of a tantalum target is started (Step S2). Then, the supply of nitrogen gas to the vacuum chamber is started during the sputtering of tantalum (Step S3).

The supply amount of nitrogen gas is variably controlled as the sputtering proceeds (Step S4). More specifically, as shown in FIG. 6, the concentration of nitrogen gas in the vacuum chamber (in an ambient environment around the silicon substrate 2) is controlled to be relatively low at the initial stage and the final stage of the copper interconnection barrier film forming step, and is controlled to be relatively high at the intermediate stage of the step. Thus, the copper interconnection barrier film 18 is formed as having a nitrogen concentration profile as shown in FIG. 3.

After a lapse of a predetermined period from the start of the sputtering, the supply of nitrogen gas is stopped (Step S5), and the sputtering with the tantalum target is ended (Step S6).

Since the nitrogen gas concentration in the vacuum chamber is controlled to be relatively low at the initial stage and the final stage of the copper interconnection barrier film forming step, the copper interconnection barrier film 18 has a relatively low nitrogen concentration or a relatively low nitridation degree in its boundary portion 11a adjacent to the first copper interconnection layer 11 and in its boundary portion 19a adjacent to the connection plug 19 (see FIG. 3). As a result, the material physical properties of the boundary portion 11a and the boundary portion 19a of the copper interconnection barrier film 18 are closer to the physical properties of tantalum, so that the copper interconnection barrier film 18 properly adheres to the first copper interconnection layer 11 and the connection plug 19.

On the other hand, the nitrogen gas concentration in the vacuum chamber is controlled to be relatively high at the intermediate stage of the copper interconnection barrier film forming step, so that the copper interconnection barrier film 18 has a relatively high nitrogen concentration in its intermediate portion 21 defined between the boundary portion 11a and the boundary portion 19a (see FIG. 3). As a result, the material physical properties of the intermediate portion 21 of the copper interconnection barrier film 18 are closer to the physical properties of tantalum nitride. Therefore, copper is prevented from diffusing into the interlevel insulating film 13 and the interlevel insulating film 15 from the first copper interconnection layer 11, the connection plug 19 and the second copper interconnection layer 20.

That is, the concentration of the nitrogen gas to be supplied into the vacuum chamber is continuously varied in the copper interconnection barrier film forming step, whereby the copper interconnection barrier film 18 is formed as having the physical properties of tantalum as well as the physical properties of tantalum nitride without an increase in the thickness of the barrier film. Since the copper interconnection barrier film 18 thus formed as having such physical properties is of a single layer structure, a complicated and time-consuming manufacturing process is not required unlike in a case in which the barrier film is configured to include tantalum films provided in boundary portions thereof adjacent to copper portions and a tantalum nitride film provided in a portion thereof between the boundary portions. That is, the manufacturing process is simplified.

While the embodiment of the present invention has thus been described, the invention may be embodied in other ways. In the embodiment described above, a so-called dual damascene process is employed for the formation of the connection plug 19 and the second copper interconnection layer 20 by way of example, but a so-called single damascene process may be employed.

While the present invention has been described in detail by way of the embodiment thereof, it should be understood that the embodiment is merely illustrative of the technical principles of the present invention but not limitative of the invention. The spirit and scope of the present invention are to be limited only by the appended claims.

This application corresponds to Japanese Patent Application No. 2006-278789 filed in the Japanese Patent Office on Oct. 12, 2006, the disclosure of which is incorporated herein by reference in its entirety.

What is claimed is:

1. A semiconductor device comprising:
a semiconductor substrate;
a first copper interconnection provided on the semiconductor substrate;
an insulating layer provided over the first copper interconnection and having a hole extending therethrough to the first copper interconnection;
a barrier layer composed of a tantalum-containing material and covering at least a sidewall of the hole and a part of the first copper interconnection exposed in the hole; and
a second copper interconnection provided in intimate contact with the barrier layer and electrically connected to the first copper interconnection via the barrier layer;
wherein the barrier layer has a nitrogen concentration profile such that a concentration of nitrogen contained in the material continuously varies to be lower in a boundary portion of the barrier layer adjacent to the first copper interconnection and in a boundary portion of the barrier layer adjacent to the second copper interconnection and higher in an intermediate portion of the barrier layer defined between the boundary portions.

2. The semiconductor device according to claim 1, wherein the insulating layer includes an interlevel film of silicon carbide and an interlevel insulating film of silicon oxide stacked on the interlevel film.

3. The semiconductor device according to claim 1, wherein the barrier layer is comprised of a single layer having a thickness of 3 to 30 nm.

4. The semiconductor device according to claim 1, wherein
the hole of the insulating layer includes a via-hole and a copper interconnection trench communicating with the via-hole,
the second copper interconnection includes a connection plug formed in the via-hole and a copper interconnection layer formed in the copper interconnection trench, and
the connection plug and the copper interconnection layer are integrally formed with each other.

5. The semiconductor device according to claim 4, further comprising a second insulating layer provided over the copper interconnection layer.

6. The semiconductor device according to claim 1, wherein the barrier layer is comprised of a single layer having a thickness of 3 to 15 nm.

* * * * *